(12) United States Patent
Hinzie et al.

(10) Patent No.: US 12,138,563 B2
(45) Date of Patent: Nov. 12, 2024

(54) CHEMICAL LIQUID MANUFACTURING APPARATUS AND METHOD OF MANUFACTURING CHEMICAL LIQUID

(71) Applicant: FUJIFILM Electronic Materials U.S.A., Inc., North Kingstown, RI (US)

(72) Inventors: Bryan Hinzie, Gilbert, AZ (US); Marcia Cole-Yocom, Scottsdale, AZ (US)

(73) Assignee: FUJIFILM Electronic Materials U.S.A., Inc., North Kingstown, RI (US)

( * ) Notice: Subject to any disclaimer, the term of this patent is extended or adjusted under 35 U.S.C. 154(b) by 0 days.

(21) Appl. No.: 16/660,815

(22) Filed: Oct. 23, 2019

(65) Prior Publication Data

US 2020/0129884 A1    Apr. 30, 2020

Related U.S. Application Data

(60) Provisional application No. 62/750,004, filed on Oct. 24, 2018.

(51) Int. Cl.
*B01D 15/36* (2006.01)
*B01D 46/54* (2006.01)

(52) U.S. Cl.
CPC ......... *B01D 15/361* (2013.01); *B01D 46/543* (2013.01); *B01D 2311/10* (2013.01); *B01D 2325/02832* (2022.08); *B01D 2325/42* (2013.01)

(58) Field of Classification Search
None
See application file for complete search history.

(56) References Cited

U.S. PATENT DOCUMENTS

| | | | |
|---|---|---|---|
| 2005/0139530 A1* | 6/2005 | Heiss | C02F 9/00 210/85 |
| 2011/0147285 A1* | 6/2011 | Bonnelye | G05B 13/0205 210/134 |
| 2014/0008228 A1* | 1/2014 | Andersen | B01D 61/54 204/519 |
| 2015/0050706 A1* | 2/2015 | Buekenhoudt | C07C 67/343 560/126 |
| 2015/0144557 A1 | 5/2015 | Ly et al. | |

(Continued)

FOREIGN PATENT DOCUMENTS

| | | |
|---|---|---|
| CN | 102500158 | 6/2012 |
| CN | 102500159 | 6/2012 |
| CN | 104254376 | 12/2014 |

(Continued)

OTHER PUBLICATIONS

"Office Action of China Counterpart Application", issued on Aug. 13, 2024, with English translation thereof, p. 1-p. 22.

(Continued)

*Primary Examiner* — Richard C Gurtowski
(74) *Attorney, Agent, or Firm* — JCIP GLOBAL INC.

(57) ABSTRACT

A chemical liquid manufacturing apparatus is provided. The manufacturing apparatus includes at least one filtration medium selected from an ion exchange medium and an ion medium, and a temperature control unit configured to control the temperature of a material to be processed by the at least one filtration medium. A method of manufacturing a chemical liquid using the apparatus is also provided.

15 Claims, 3 Drawing Sheets

(56) References Cited

U.S. PATENT DOCUMENTS

2020/0181179 A1* 6/2020 Fields .................... A01N 57/20

FOREIGN PATENT DOCUMENTS

| | | |
|---|---|---|
| CN | 105122143 | 12/2015 |
| JP | 2009218405 | 9/2009 |
| JP | 2016075920 | 5/2016 |
| JP | 2016155121 | 9/2016 |
| KR | 20050070511 | 7/2005 |
| WO | 2018051716 | 3/2018 |
| WO | 2018061485 | 4/2018 |
| WO | 2018084302 | 5/2018 |
| WO | 2018142888 | 8/2018 |
| WO | 2018151164 | 8/2018 |
| WO | 2019191520 | 10/2019 |
| WO | 2020106567 | 5/2020 |

OTHER PUBLICATIONS

"Office Action of Taiwan Counterpart Application", issued on Sep. 3, 2024, with English translation thereof, p. 1-p. 23.

\* cited by examiner

CHEMICAL LIQUID MANUFACTURING APPARATUS AND METHOD OF MANUFACTURING CHEMICAL LIQUID

CROSS-REFERENCE TO RELATED APPLICATION

This application claims the priority benefit of U.S. provisional application Ser. No. 62/750,004, filed on Oct. 24, 2018. The entirety of the above-mentioned patent application is hereby incorporated by reference herein and made a part of this specification.

BACKGROUND

1. Related Field

The present disclosure relates to a chemical liquid manufacturing apparatus and a method of manufacturing a chemical liquid using the same.

2. Description of the Related Art

The semiconductor industry has achieved rapid improvements in integration density of electronic components, which are arisen from continuous reductions in the component size. Ultimately, more of the smaller components are afforded to be integrated into a given area. These improvements are mostly due to the development of new precision and high resolution processing techniques.

During the manufacturing of high resolution integrated circuits (ICs), various processing liquids will come into contact with a bare wafer or a film-coated wafer. For example, the fabrication of a fine metal interconnection typically involves a procedure of coating a base material with a pre-wetting liquid before the base material is coated with a composite liquid to form a resist film. These processing liquids, containing proprietary ingredients and various additives, are known to be a source of contamination of IC wafer.

One can speculate that even if a trace amount of contaminants is mixed into these chemical liquids, such as a wafer pre-wetting liquid or a developer solution, the resulting circuit patterns may have defects. It is known that the presence of very low levels of metal impurities, as low as 1.0 ppt, interferes with the performance and stability of semiconductor devices. And depending on the kind of metallic contaminants, oxide property may deteriorate, inaccurate patterns are formed, electrical performance of semiconductor circuits is impaired, which eventually adversely impact manufacturing yields.

The contamination of impurities, such as metal impurities, fine particles, organic impurities, moisture, and the like, may be inadvertently introduced in a chemical liquid during various stages of the manufacturing of the chemical liquid. Examples of such include a case where impurities are presented in a raw material, or a by-product generated or an unreacted reactant remained when the chemical liquid is manufactured, or foreign matters eluded or extracted from the surface of the manufacturing apparatus or from a container equipment, reaction vessels, or the like used in transporting, storing or reacting. Hence, a reduction or removal of insoluble and soluble contaminants from these chemical liquids used for the production of highly precise and ultra-fine semiconductor electronic circuits is a basic assurance of producing defective-free ICs.

In this respect, it is imperative to significantly improve and to rigorously control the standard and quality of a chemical liquid manufacturing process and a manufacturing apparatus applied in the process in order to form high purity chemical liquids, which are indispensable in the fabrication of ultra-fine and immensely precise semiconductor electronic circuits.

SUMMARY

Accordingly, to form highly precise integrated circuits, the demands for ultra-pure chemical liquids, and the quality improvement and control of theses liquids become very critical. Specific key parameters targeted for quality improvement and control include: trace-metal reduction, liquid particle count reduction, on-wafer defect reduction, organic contaminant reduction, etc. All of these key parameters are shown to be impacted by a requisite preparation of a manufacturing apparatus and a proper design of a manufacturing process.

In view of the above, the present disclosure is to provide particularly a chemical liquid manufacturing apparatus and a method of manufacturing a chemical liquid using the same for preparing a chemical liquid targeted for semiconductor manufacturing, wherein an ultra-pure chemical liquid is produced with the number of particulates and the amount of metallic impurities in the chemical liquid managed within predetermined ranges and without the generation or introduction of unknown and unwanted substances. Hence, the occurrence of residue and/or particle defects is suppressed and the yield of semiconductor wafer is improved.

In accordance with some embodiments of the present disclosure, a chemical liquid manufacturing apparatus includes at least a first system, wherein the first is configured to process a material. The first system includes at least one first filtration medium selected from a first ion exchange membrane and a first ion adsorption membrane; and a temperature control unit configured at an upstream side of the at least one first filtration medium.

In accordance with some embodiments of the present disclosure, a method of manufacturing a chemical liquid includes providing a system that includes at least an ion exchange membrane and/or an ion adsorption membrane; configuring a temperature control unit an upstream side of the at least ion exchange membrane and/or ion adsorption membrane to adjust a temperature of a material; and processing the material with the system.

According to the present disclosure, a chemical liquid manufacturing apparatus and a method of manufacturing a chemical liquid using the same are effectively designed and properly configured to obviate an introduction or generation of a wide range of organic and inorganic contaminants during the production process and to produce an ultra-high purity chemical liquid applicable in semiconductor manufacturing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
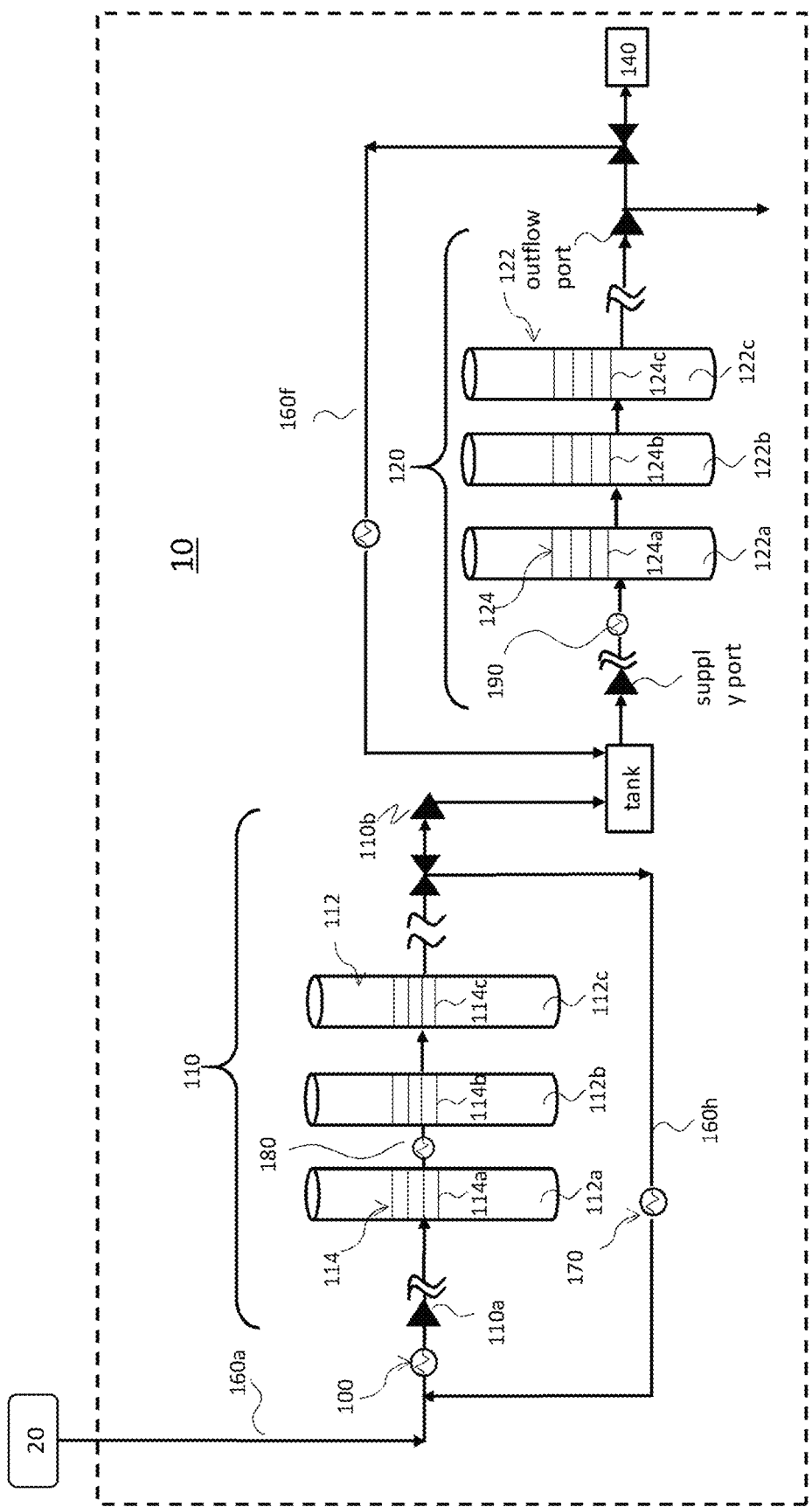
FIG. 1 is a schematic diagram showing an exemplary chemical liquid manufacturing apparatus adopted in a FIG. 2. is a flow chart of process steps in an exemplary method of manufacturing a chemical liquid in accordance with some embodiments of the present disclosure

The following disclosure provides many different embodiments or examples, for implementing different features of the provided subject matter. Specific examples of components and arrangements are described below to simplify the present disclosure. These are, of course, merely examples and are not intended to be limiting. For example, when the term "solvent(s)" is used, if not specifically stated (unless otherwise noted), it may refer to a single solvent or a combination of two or more solvents. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a numerical range indicated by using a term "to" means a range which includes numerical values described before and after the term of "to", as a lower limit value and an upper limit value.

In the present disclosure, "ppm" means "parts-per-million (10-6)", "ppb" means "parts-per-billion (10-9)" and "ppt" means "parts-per-trillion(10-12)".

In the present disclosure, 1 Å (angstrom) corresponds to 0.1 nm (nanometer) and 1 μm (micron) corresponds to 1000 nm.

Chemical Liquid

In the present disclosure, a chemical liquid may include a wafer processing solution such as, a pre-wetting liquid, a developer solution, a rinsing solution, a cleaning solution, a stripping solution and the like, or a raw material solvent used for the production thereof.

Prior to being subjected to a manufacturing process of the present disclosure which includes, but are not limited to, a purification process, a chemical liquid may contain an undesirable amount of contaminants and impurities. After the chemical liquid is processed by the manufacturing process of the present disclosure by adopting a chemical liquid manufacturing apparatus of the present disclosure, substantial amounts of the contaminants and impurities are removed from the chemical liquid. A pre-processed chemical liquid is referred herein in the present disclosure as a "processing target material". The processing target material may be synthesized in house or commercially available via purchasing from a supplier. A post-processed chemical liquid is referred in the present disclosure as a "processed chemical liquid", and also simply as a "chemical liquid". A "processed chemical liquid" or a "chemical liquid" may include impurities secured and limited within predetermined ranges.

Organic Solvent

In the present disclosure, the chemical liquid includes an organic solvent. The type of organic solvent is not particularly limited, but well-known organic solvents are applicable. The content of the organic solvent in the chemical liquid is not particularly limited, but the organic solvent is included as the main component. Specifically, the content of the organic solvent is equal to or greater than 98 mass % with respect to the total mass of the chemical liquid. In certain embodiments, the content of the organic solvent is equal to or greater than 99 mass % with respect to the total mass of the chemical liquid. In other embodiments, the content of the organic solvent is equal to or greater than 99.5 mass % with respect to the total mass of the chemical liquid. In yet other embodiments, the content of the organic solvent is equal to or greater than 99.8 mass % with respect to the total mass of the chemical liquid. The upper limit value thereof is not particularly limited, but it is in general that the upper limit value thereof is equal to or smaller than 99.999 mass %.

The organic solvent may be singly used or may be used in combination of two kinds or more thereof. In a case where a combination of two kinds or more of organic solvents is used, it is preferable that the total content thereof is in the above range.

The content of the organic solvent in the chemical liquid can be measured by using a gas chromatography mass spectrometry (GCMS) device.

The boiling point of the organic solvent is not particularly limited. However, the boiling point of the organic solvent is preferably lower than 200° C. from a point of improving manufacturing yield of a semiconductor chip. In this disclosure, the boiling point means a boiling point at 1 atm.

The organic solvent is not particularly limited. Examples of the organic solvent include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-heptanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methyl cyclohexanol, trimethyl cyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2,2-trifluoroethyl ethyl ether, ethyl vinyl ether, butyl vinyl ether, allyl ethyl ether, allyl propyl ether, allyl butyl ether, diallyl ether, 2-methoxypropene, ethyl-1-propenyl ether, cis-1- bromo-2-ethoxyethylene, 2-chloroethyl vinyl ether, allyl-1, 1,2,2-tetrafluoroethyl ether, octane, isooctane, nonane, decane, methylcyclohexane, decalin, xylene, ethylbenzene, diethylbenzene, cumene, second-butylbenzene, cymene, dipentene, methyl pyruvate, monomethyl ether, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, γ-butyrolactone, diisoamyl ether, isoamyl acetate, chloroform, dichloromethane, 1,4-dioxane, hexyl alcohol, 2-heptanone, isoamyl acetate, and tetrahydrofuran.

In certain embodiments of the present disclosure, the chemical liquid is a pre-wetting liquid. The type of pre-wetting liquid is not particularly limited. Specific examples of a pre-wetting liquid include at least one of cyclopentanone (CyPe), cyclohexanone (CyH), monomethyl ether, propylene glycol monomethyl ether (PGME), propylene glycol monoethyl ether (PGEE), propylene glycol monomethyl ether acetate (PGMEA), propylene glycol monopropyl ether (PGPE), ethyl lactate (EL). In other embodiments, the chemical liquid may be a developer solution such as butyl acetate, or a rinsing liquid such as 4-methyl-2-pentanol (MIBC).

Impurities

Impurities contained in a processing target and/or a chemical liquid include metallic impurities, particles, and others such as organic impurities, moisture, etc.

Metallic Impurities

The most common metallic impurities include heavy metals such as iron (Fe), aluminum (Al), chromium (Cr), nickel (Ni) and ionic metals such as sodium (Na) and calcium (Ca). Depending on the type of metal, metal impurities deteriorate oxide integrity, degrade MOS gate stacks, reduce lifetime of devices, etc. In a chemical liquid manufactured by the chemical liquid manufacturing apparatus according to the manufacturing method of the present disclosure, the total trace metal content is preferred to be within a predetermined range of 0 to 300 ppt, more preferably 0 to 150 ppt in mass.

In this disclosure, metal impurities refer to metal impurities that are provided in a form of a solid (metal simplex, particulate metal-containing compound, and the like).

Particles

In the present disclosure, the counting targets which have a size of 0.03 μm or greater are referred to as "particles" or "particulates". The number of "particles" in a liquid medium are to be countered by a light scattering type in-liquid particle counter and is referred as LPC (liquid particle count).

Examples of particles include dust, dirt, organic solid matters, and inorganic solid matters. The particles also may include impurities of colloidalized metal atoms. The type of the metal atoms that are easily colloidalized is not particularly limited, and may include at least one metal atom selected from the group consisting of Na, K, Ca, Fe, Cu, Mg, Mn, Li, Al, Cr, Ni, Zn, and Pb. In a chemical liquid prepared by the chemical liquid manufacturing apparatus of the present disclosure, the total content of the particles having a size of 0.03 μm or more is preferred to be within a predetermined range of 100 or less per 1 ml of the chemical liquid.

Organic Impurities

Organic impurities mean a compound which is different from the organic solvent as the main component provided in the chemical liquid and refer to organic matter which is contained in the content of 5000 mass ppm or smaller with respect to the total mass of the chemical liquid corresponds to the organic impurities and does not correspond to the organic solvent.

Volatile organic compounds are present in ambient air even inside a clean-room. Some of the organic impurities originate from the shipping and storage equipment, while some are presented in a raw material from the start. Other examples of organic impurities include a by-product generated when the organic solvent is synthesized and/or an unreacted reactant.

The total content of the organic impurities in the chemical liquid is not particularly limited. From a point of improving the manufacturing yield of a semiconductor device, the total content of the organic impurities is preferably 0.1 to 5000 mass ppm, more preferably 1 to 2000 mass ppm, further preferably 1 to 1000 mass ppm, particularly preferably 1 to 500 mass ppm, and most preferably 1 to 100 mass ppm, with respect to the total mass of the chemical liquid.

The content of the organic impurities in the chemical liquid can be measured by using a gas chromatography mass spectrometry (GCMS) device.

Chemical Liquid Manufacturing Apparatus

FIG. 1 is a schematic diagram showing a configuration of an exemplary chemical liquid manufacturing apparatus according to some embodiments of the present disclosure. As shown in FIG. 1, the chemical liquid manufacturing apparatus 10 is connected to a processing target supply unit 20 configured to hold or transport a material, for example a processing target material or a pre-processed chemical liquid. The processing target material is going to be processed by the chemical liquid manufacturing apparatus 10 to produce or manufacture a chemical liquid in which the number of unwanted contaminants, including particulates, organic impurities, metallic impurities, etc., are managed and limited within predetermined ranges. In some embodiments, the chemical liquid includes, but are not limited to, monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, diisoamyl ether, 4-methyl-2-pentanol, etc. The processing target supply unit 20 is not particularly limited as long as it continuously or intermittently supplies the processing target material to the chemical liquid manufacturing apparatus 10. The processing target supply unit 20 may include a material receiving tank, a sensor such as a level gauge (not shown), a pump (not shown), a valve for controlling the flow of the processing target material (not shown), etc. In FIG. 1, the chemical liquid manufacturing apparatus 10 is connected to one processing target supply unit 20. However, the present disclosure is not limited as such. In some exemplary embodiments, a plurality of processing target supply units 20 is provided in parallel for each type of processing target materials to be processed by the chemical liquid manufacturing apparatus 10.

As shown in FIG. 1, the chemical liquid manufacturing apparatus 10 includes at least a first purification system 110. In certain exemplary embodiments, the chemical liquid manufacturing apparatus 10 may include a heat exchanger 100 for setting the temperature of the processing target material within a certain temperature range; as such, the processing target material charging into the chemical liquid manufacturing apparatus 10 is maintained at a substantially consistent temperature. The heat exchanger 100 is configured, for example, between the processing target supply unit 20 and the first purification system 110. In some embodiments, the temperature of the processing target material is at ambient temperature (e.g. room temperature).

Still referring to FIG. 1, the first purification system 110 includes at least one or plural filtration media 114 (purification means), each having a specific purification function (based on the mode or medium of the filtration unit) and offering a specific treatment. For example, the purification system 110 may include at least one filtration medium 114 (114a, 114b or 114c) selected from an ion exchange membrane and an ion adsorption membrane. In some embodiments, the purification system 110 includes at least a particle removal filter, and at least an ion exchange membrane and/or an ion adsorption membrane. Further, the one or plural filtration media 114 are high-quality grade products that are commercially available from suppliers.

In accordance to certain exemplary embodiments, the one or plural filtration media 114 may be compartmentalized and contained in one or plural housings 112, respectively. For example, the first purification system 110 may include at least one housing 112 selected from a first housing 112a, a second housing 112b and a third housing 112c, and the at least one housing 112 includes and accommodates one or plural units of filtration medium 114 therein. Alternatively speaking, according to the examples above, the first purification system 110 may include just one housing 112 (either the first housing 112a, the second housing 112b, or the third housing 112c), or two housings 112 (a combination of any two of the first housing 112a, the second housing 112b, and the third housing 112c), or three housings (the first housing 112a, the second housing 112b, and the third housing 112c). It is noted that the above examples are for illustrative purposes, and the number of housings is not limited to the shown examples. In other exemplary embodiments, the first purification system 110 may include more housings 112, for example, one, two, three, six, or ten more, in addition to above first, second and/or third housings (112a, 112b, 112c).

In alternative exemplary embodiments, there may be no separate housings 112, and the one or plural filtration media 114 are configured un-compartmentalized in the first purification system 110. In yet other alternative exemplary embodiments, the first purification system 110 may also include other purification modules (not shown) in addition to the one or plural filtration media 114.

Still referring to FIG. 1, the first housing 112a may include one or plural units of the first filtration medium 114a, the second housing 112b may include one or plural units of the second filtration medium 114b, the third housing 112c may include one or plural units of the third filtration medium 114c, wherein the first, second, and third filtration media 114a, 114b and 114c may be different in functionality or property, and offer different purification treatments, while the one or more units of the filtration medium 114 (114a, 114b, 114c) accommodated in each of the selected housings 112 (112a, 112b, 112c), respectively, have the same or similar purification function, physiochemical properties, pore size and/or construction material, etc. As an example, the first purification system 110 may include one or plural particle removal filters, one or plural ion exchange membranes, and one or plural ion adsorption membranes accommodated in the first housing 112a, the second housing 112b, and the third housing 112c, respectively. In another example, the first purification system 110 may include one or plural particle removal filters and one or plural ion exchange membranes (or one or plural ion adsorption membranes) accommodated in the first housing 112a and the second housings 112b, respectively. In yet another example, the first purification system 110 may include one or plural ion exchange membranes and one or plural ion adsorption membranes accommodated in the first housing 112a and the second housings 112b, respectively. It is noted that the above examples are for illustrative purposes and are not intended to be limiting.

As shown in FIG. 1, the first purification system 110 includes also a temperature control unit 180 configured upstream of an entry port of the at least one housing 112. According to the embodiments of the disclosure, a temperature control unit 180 is configured upstream of an entry port of a selected housing 112 that accommodates one or plural ion exchange membranes or one or plural ion adsorption membranes, so that the temperature of the processing target material passing through the selected housing 112 is regulated to a predetermined optimal temperature range. The temperature control unit 180 includes, but are not limited to, a commercial re-circulating heating/cooling unit, a condenser, or a heat exchanger installed, for example on the piping, at an upstream side of the entry port of the selected housing 112.

In some exemplary embodiments, the temperature control unit 180 includes a cooling unit, and the temperature control unit 180 is configured at a temperature of about 80° F. or below, preferably about 65° F. or below so that the temperature of the processing target is regulated to about 80° F. or below as it passes through the one or plural ion exchange membranes, or one or plural ion adsorption membranes in the selected housing 112. In other embodiments, the temperature control unit 180 is set within a temperature range of about 30 to 70° F. In yet other embodiments, the temperature control unit 180 is preferably set within the temperature range of about 41 to 67° F. In alternative embodiments, the temperature control unit is more preferably set within the temperature range of about 50 to 65° F. In accordance to the certain embodiments of the disclosure, the temperature control unit 180 is averted from rising to 70° F. or above. In some embodiments, the temperature control unit 180 is controlled from rising to 68.5° F. or above. In yet other embodiments, the temperature control unit 180 is regulated from rising to 67.5° F. or above.

As in the examples illustrated in FIG. 1, a temperature control unit 180 is configured between the first housing 112a and the second housing 112b, and the temperature of the processing target material is adjusted by the temperature control unit 180 to 65° F. or below before the processing target material is charged into and processed in the second housing 112b, wherein the second housing 112b accommodates either one or plural ion-exchange filtration media, or one or plural ion-adsorption filtration media. In the above examples, the first housing 112a may contain one or plural particle removal filters, and the particle removal filters may have a pore size of 20 nm or more, for example. It should be appreciated that the arrangement sequences of the housings 112 and the filtration media 114 as exemplified in above examples are for illustrative purposes and are not intended to be limiting.

It should be noted also that the position of the temperature control unit 180 is not limited to the shown examples above. In other exemplary embodiments, a temperature control unit 108 may be configured upstream of the entry of the first housing 112a, wherein the first housing 112a accommodates one or plural ion exchange membranes, or one or plural ion adsorption membranes. In this respect, another temperature control unit may or may not be installed downstream of the first housing 112a prior to the entry of subsequent housings (e.g. housing 112b and/or 112c). Configuring another temperature control unit downstream of the first housing 112a is optional under the proviso that no other means or equipment, which may re-introduce thermal energy into the processing target material such as a pump, is introduced or disposed between the first housing 112a and the subsequent housings (e.g. second or third 112b or 112c) that accommodate other or additional ion exchange media and/or ion adsorption media.

In certain exemplary embodiments, there may be no separate housings 112 in the first purification system 110, and the one or plural filtration media 114 are configured un-compartmentalized in the first purification system 110. For example, the first purification system 110 is a multistage system comprising the replaceable filtration media 114 (114a, 114b, 114c,) that are concatenated together inside the first purification system 110, and the processing target material is caused to cascade through the filtration media 114 (114a, 114b, 114c,). In this respect, a temperature control unit 180 may be configured at any position upstream of a first ion exchange membrane or ion adsorption membrane through which the processing target material passes or cascades through. For example, if the first purification system 100 houses, in sequence and downstream of its supply port 110a, particle removal filter A, particle removal filter B, ion exchange membrane A, ion exchange membrane B, and an ion adsorption membrane A, a temperature control unit 180 may be configured between particle removal filter B and ion exchange membrane A to have the temperature of the processing target material adjusted and regulated to about 80° F. or below, preferably about 65° F. or below, before the processing target material passes through and is processed by the ion exchange membrane A, and by the subsequent ion exchange membrane B and an ion adsorption membrane A. It is noted that the above examples are for illustrative purposes and are not intended to be limiting.

In other examples, the temperature control unit 180 may be configured upstream of the particle removal filter A or between particle removal filters A and B, as long as the temperature of the processing target material remains suppressed to the above-discussed temperature range, for example, about 80° F. or below, preferably about 65° F. or below, as the processing target material is processed by the ion exchange membrane A, and the subsequent ion exchange membrane B and ion adsorption A.

In some exemplary embodiments, the first purification system 110 may also include a recirculation conduit 160h for recirculating a partially-purified processing target back to the first purification system 110 and to be processed by the first purification system 110 again. Also, another temperature control unit/heat exchange 170 may be configured along the recirculation conduit 160h. In certain embodiments, the temperature control unit 170 may be configured also at a temperature of about 80° F. or below, preferably about 65° F. or below, so that the temperature of the partially-purified processing target is regulated to about 80° F. or below as it being recirculated back to the first purification system 110. Although in the examples as shown in FIG. 1, the recirculation conduit 160h is configured at the upstream side of the outflow port 110b of the first purification system 110. In other examples, the recirculation conduit 160h may be configured at the downstream side of the outflow port 110b. It is understood that pumps and valves may be installed at the various conduits, outflow ports and supply ports at the processing target supply unit 20, the heat exchanger 100, the first material purification system 110, etc. as necessary.

In accordance to the non-limiting embodiments as described above, the chemical liquid manufacturing apparatus 10 may further include a second purification system 120 communicating with the first purification system 110 either directly or indirectly, wherein the second purification system 120 includes one or plural filtration media 124. In the exemplary embodiments as shown in FIG. 1, the second purification system 120 is configured downstream of the first purification system 110; however, it is noted that the relative configurations of the first purification system 110 and the second purification system 120 are not limited to the shown examples above.

The one or plural filtration media 124 in the second purification system 120 may be compartmentalized and contained in one or plural housings 122, respectively. For example, the second purification system 120 may include at least one housing 122 selected from a fourth housing 122a, a fifth housing 122b and a sixth housing 122c, and the at least one housing 122 includes and accommodates one or plural units of filtration medium 124 therein. Alternatively speaking, the second purification system 120 may include one, two, or three housings 122. In other exemplary embodiments, the second purifying system 120 may include more housings 122 in addition to the fourth housing 122a, the fifth housing 122b and the sixth housing 122c. Further, there may be no separate housings 122, and the one or plural filtration media 124 are configured un-compartmentalized in the second purification system 120. In yet other exemplary embodiments, the second purification system 120 also may include other unillustrated purification modules, in addition to the one or plural filtration media 124.

According to the examples described above, the fourth housing 122a may include one or plural units of the fourth filtration medium 124a, the fifth housing 122b may include one or plural units of the fifth filtration medium 124b, the sixth housing 122c may include one or plural units of the sixth filtrations medium 124c, wherein the fourth filtration medium 124a, the fifth filtration medium 124b, and the sixth filtration medium 124c may be different in functionality or property, and offer different purification treatments, while the one or more units of the filtrations medium 124 (124a, 124b, 124c) accommodated in each of the selected housings 122 (122a, 122b, 122c), respectively, have the same or similar purification function, physiochemical properties, pore size and/or construction material, etc. For example, the second purification system 120 may include a filtration medium 124 (124a, 124b, 124c) selected from a particle removal filter, an ion exchange membrane, and an adsorption membrane.

Similar to the first purification system 110, a temperature control unit 190 may be configured upstream of an inlet of a housing 122 that accommodates one or plural ion exchange membranes or one or plural ion adsorption membranes, so that the temperature of the chemical liquid passing through the housing 122 is regulated to a predetermined optimal temperature range. The principles of application, layout, and specifications of the temperature control unit 190 adopted in the second purification system 120 are similar to those described for the first purification system 110 as exemplified in paragraphs [0051] to [0058].

According to the exemplary embodiments as illustrated in FIG. 1, a temperature control unit 190 may be configured at an upstream side of the entry port of the fourth housing 122a, wherein the fourth housing 122a accommodates one or plural ion exchange membranes or ion adsorption membranes, and the temperature of the processing target is adjusted by the temperature control unit 190 to about 80° F. or below, preferably about 65° F. or below before the processing target material enters into the fourth housing 122a of the second purification system 120. In other embodiments, the temperature control unit 190 is set within a temperature range of about 30 to 70° F. In yet other embodiments, the temperature control unit 190 is preferably set within the temperature range of about 41 to 67° F. In alternative embodiments, the temperature control unit 190 is more preferably set within the temperature range of about 50 to 65° F. It is noted that, in certain embodiments, the temperature control unit 190 is averted from configuring at a temperature of 70° F. or above. In some embodiments, the temperature control unit 190 is controlled from rising to 68.5° F. or above; yet in other embodiments, the temperature control unit 190 is regulated from rising to 67.5° F. or above. As an example, the fifth or sixth housing (122b or 122c) may contain one or plural particle removal filters having a pore size of 10 nm or less.

It is noted that the arrangement sequences of the housings 122 and the filtration media 124 as exemplified in above examples are for illustrative purposes and are not intended to be limiting. In some embodiments, the temperature control unit 190 may be configured between the fourth housing 122a and the fifth housing 122b in the second purification system 120, and the temperature of the processing target material is adjusted by the temperature control unit 190 to the desired temperature range before the processing target material is charged into the fifth housing 112b, wherein the fifth housing 112b accommodates either an ion-exchange filtration medium 114b or an ion-adsorption filtration medium 114b, and the fourth housing 112a may contain one or plural particle removal filters. Further, another temperature control unit may or may not be installed downstream of the fifth housing 122b. Installation of another temperature control unit is optional under the proviso that no other means or process equipment, which may re-introduce thermal energy into the processing target material, such as a pump, is introduced or disposed between the fifth housing 122b and the subsequent housings (for example the sixth housing 112c) that house other ion exchange media or ion adsorption media. It should be appreciated that the location of the temperature control unit 190 is not limited to the shown examples above.

In some exemplary embodiments, the second purification system 120 may also include a recirculation conduit 160f for recirculating the partially-purified processing target back to the second purification system 110 and to be processed by the second purification system 110 again. Also, another temperature control unit/heat exchange may be installed along the recirculation conduit 160f.

Method of Manufacturing a Chemical Liquid

Figure 2:
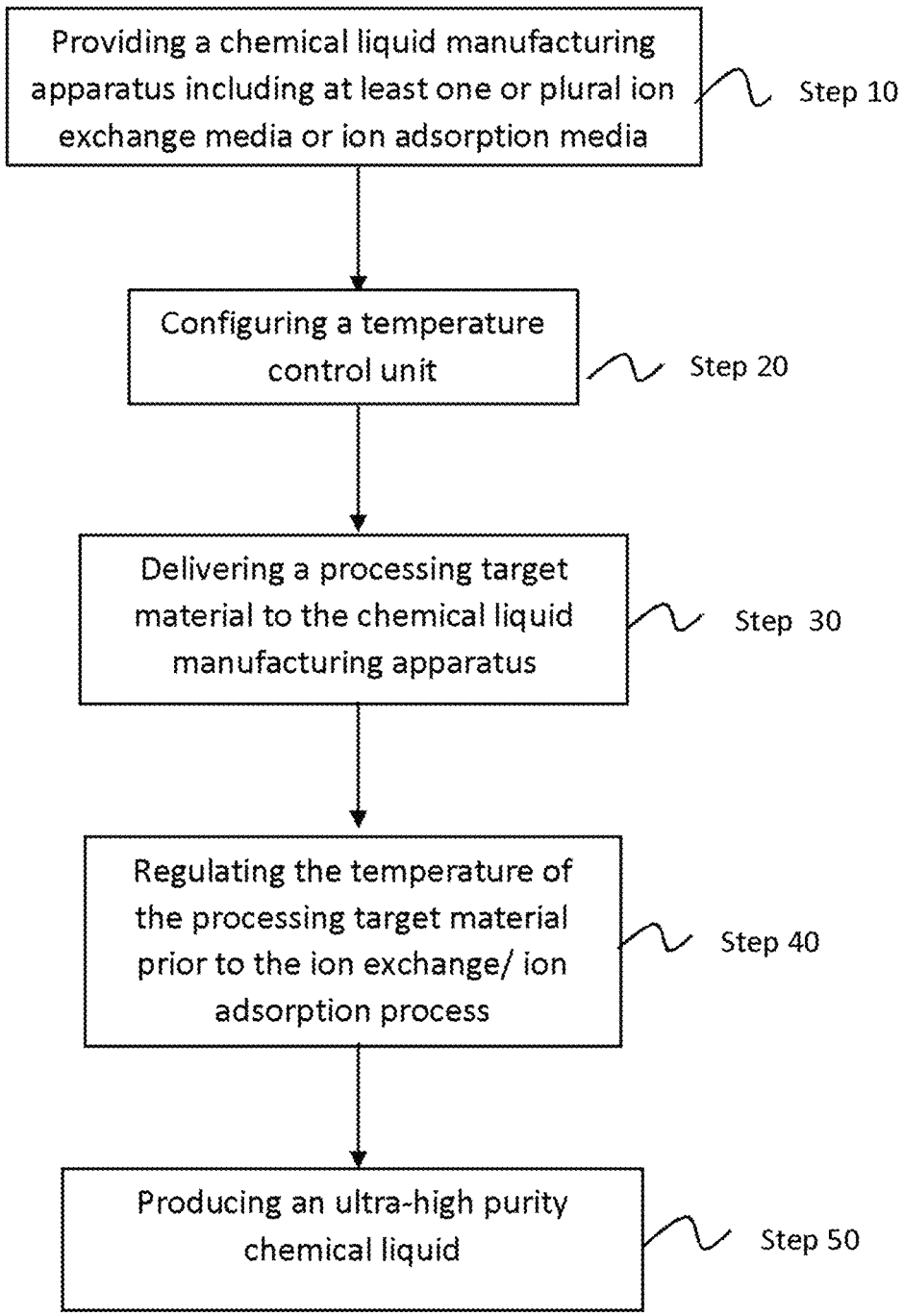

FIG. 2 is a flow chart of process steps in an exemplary method of manufacturing a chemical liquid in accordance with some embodiments of the present disclosure.

Referring to both FIGS. 1 and 2, a method of manufacturing a chemical liquid, according to some embodiments, includes providing a chemical liquid manufacturing apparatus 10 in Step 10 for the manufacturing of a chemical liquid. In accordance to the exemplary embodiments of the disclosure, the chemical liquid manufacturing apparatus 10 comprises at least a first purification system 110 housing one or plural first filtration media 114, wherein the first filtration media 114 includes at least one or plural ion exchange membranes and/or one or plural ion adsorption membranes. In certain exemplary embodiments, the chemical liquid manufacturing apparatus 10 comprises a second purification system 120 in addition to the at least first purification system 110.

Referring next to Step 30, a pre-processed chemical liquid or a processing target material is delivered to the first purification system 110 of the chemical liquid manufacturing apparatus 10. The processing target material may include an organic solvent containing a metal component selected from the group of metal elements consisting of iron (Fe), chromium (Cr), nickel (Ni) and lead (Pb), and the content of the metal component in the pre-processed chemical liquid ranges from about 0.1 to 1000 mass ppt. In other embodiments, the content of the metal component contained in the pre-processed chemical liquid may range from 200 to 1000 mass ppt. In yet other embodiments, the content of the metal component contained in the pre-processed chemical liquid ranges from 500 to 1000 mass ppt.

Still referring FIGS. 1 and 2, the method of manufacturing a chemical liquid includes adjusting the temperature of the processing target material to a predetermined optimal temperature range in Step 40. More particularly, in accordance to certain embodiments of the disclosure, the temperature of the processing target material is adjusted to about 65° F. or below before entering an entry port of a housing 112 that accommodates one or plural ion exchange membranes or one or plural ion adsorption membranes. For example, in accordance the examples as shown in FIG. 1, the temperature of the processing target material is adjusted to about 80° F. or below, preferably about 65° F. or below before entering the second housing 112b so that the temperature of the processing target material passing through second housing 112b is regulated to the predetermined optimal temperature range temperature range of about 80° F. or below. In some embodiments, the temperature of the processing target material may be adjusted to be within a temperature range of about 30 to 70° F. In yet other embodiments, the temperature of the processing target material is preferably regulated within the temperature range of about 41 to 67° F. In alternative embodiments, the temperature of the processing target material is more preferably regulated within the temperature range of about 50 to 65° F. In accordance to some embodiments of the disclosure, the temperature of the processing target material is regulated from rising to 70° F. or above. In other embodiments, the temperature of the processing target material is regulated from rising to 68.5° F. or above. In yet other embodiments, the temperature of the processing target material is regulated from rising to 67.5° F. or above.

The temperature control of the processing target material may be achieved by installing a temperature control unit 180, in Step 20, for example, on the piping located upstream of the entry port of the selected housing or enclosing the selected housing (for example, the second housing 112b as in the above examples) with a thermal unit to adjust and maintain the temperature of the processing target material at the desired predetermined temperature range while it passes through and is being processed in the selected housing accommodating one or plural ion exchange media or ion adsorption media.

It is noted that the above examples are for illustrative purposes, and the sequence of the process steps is not limited to the shown examples. In other exemplary embodiments, the sequence of the delivery step (for example, Step 30) and the temperature-regulating step (for example, Step 40) may be reversed. For example, the temperature of the processing target material may be regulated to the predetermined optimal temperature range of about 80° F. or below, preferably about 65° F. or below, first, and then the temperature-regulated processing target material is delivered to the chemical liquid apparatus 10 comprising the one or plural ion exchange media or the ion adsorption media. As an example, the temperature of the processing target material is regulated to the predetermined optimal temperature range of about 80° F. or below, preferably about 65° F. or below, by the temperature control unit/heat exchange 170 configured along the recirculation conduit 160$h$ before the processing target material is returned to the first purification system 110. It is noted that the above examples are for illustrative purposes, and are not intended to be limiting. In accordance to the above exemplary embodiments, no other means is present for heat or thermal energy to be re-introduced into the processing target material between the temperature-regulating step and the delivery step. Alternatively speaking, the temperature of the processing target material remains substantially at the predetermined optimal temperature range during the ion exchange or ion adsorption process.

The method of manufacturing a chemical liquid may include optionally recirculating the processing target through and be processed by the first purification system 110 system again. The method also may include delivering the processing target to the second purification system 120 and processing the processing target by the one or plural second filtration media 124 in the second purification system 120 for one or plural times.

As soon as the number of particles and the amount of metallic impurities, collected and detected from the processed chemical liquid at the end of the processing by the first purification system 110 or a combination of the first and the second purification system 120, are controlled within the predetermined ranges, an ultra-high purity chemical liquid containing, for example, 0.1 to 100 mass ppt of a metal component selected from the group of metal elements consisting of iron (Fe), chromium (Cr), nickel (Ni) and lead (Pb), is produced in Step 50. Subsequently, the ultra-high purity chemical liquid is transferred to either a next stage of manufacturing or to packaging 140.

Particle Removal Filter

The particle removing process is a process of removing particles and/or metal impurities (metal impurities in a solid form) in a processing target, such as a chemical liquid, by using a particle removal filter. The particle removal filter is not particularly limited, and well-known particle removal filters can be used.

Although the average pore size (pore diameter) of the filter is not particularly limited, it is suitably about 0.001 to 1.0 μm (1 nm to 1000 nm), preferably about 0.003 to 0.5 μm (3 nm to 500 nm), and more preferably about 0.005 to 0.1 μm (5 nm to 100 nm). Within this range, it is possible to reliably remove foreign matters such as impurities or aggregates contained in the refined product while suppressing clogging of the filter. In certain embodiments of the disclosure, the first purification system 110 may include a particle removal filter having an average pore size as small as 2 nm (for example, microfiltration membrane having a pore size of 2 nm or greater), and may range from 0.002 μm (2 nm) or more to about 1.0 μm (1000 nm) or less. In a case where fine particles are provided in the processing target in addition to colloidalized impurities including metal atoms such as iron or aluminum, the processing target is filtered by using a filter having an average pore size as small as 50 nm to remove particles before filtering is performed by using a filter having average pore size as small as 20 nm or 15 nm to remove finer particles. Thus, the filtration efficiency is improved and performance of removing particles is more improved.

In some embodiments of the disclosure, the second filtration system 122 may include a particle removal filter having a pore size as small as 0.001 μm (1 nm), and may range from about 0.001 μm (1 nm) or more to about 0.015 μm (15 nm) or less. In certain embodiments, the second filtration system 120 may include a UPE filter having a pore size as small as 1 nm. Yet in other embodiments, the second filtration system 120 may include a Nylon or a MPTFE filter having a pore size of about 5 nm. Here, the average pore size can refer to the nominal value of the filter manufacturer.

Examples of the material of the filter used in particle removal include a fluororesin such as polytetrafluoroethylene (PTFE), a polyamide resin such as nylon and the like, a polyolefin resin (including high density and ultrahigh molecular weight) such as polyethylene and polypropylene (PP) and the like, a perfluoroalkoxy (PFA) resin and the like, or a modified polytetrafluoroethylene (MPTFE). In view of efficiently removing fine foreign matters such as impurities and/or aggregates contained in a chemical liquid, the filter used in particle removal of the present disclosure is made of at least one selected from the group consisting of nylon, polypropylene (including high density polypropylene), polyethylene, polytetrafluoroethylene, tetrafluoroethylene-perfluoroalkyl vinyl ether copolymer, polyimide, and polyamdie imide. According to the filter made of the above material, it is possible to effectively remove foreign matter having high polarity which is likely to cause residue defects and/or particle defects, and it is possible to efficiently reduce the content of the metal component in the chemical liquid.

Polyimide and/or polyamide imide may have at least one selected from the group consisting of a carboxy group, a salt type carboxy group, and a —NH-bond. Regarding solvent resistance, a fluororesin, polyimide, and/or polyamide imide is excellent.

Ion-Exchange Resin Membrane (Ion-Exchange Membrane)

The ion-exchange resin membrane used in the present embodiment is not particularly limited, and filters including an ion-exchange resin comprising a suitable ion-exchange group immobilized to a resin membrane may be used. Examples of such ion-exchange resin membranes include strongly acidic cation-exchange resins comprising a cation-exchange group such as a sulfonic acid group chemically modified on the resin membrane, and examples thereof include cellulose, diatomaceous earth, nylon (a resin having an amide group), polyethylene, polypropylene, polystyrene, a resin having an imide group, a resin having an amide group and an imide group, a fluororesin, or a high-density polyethylene membrane and ion-exchange resin membranes with a particle-removing membrane that is a membrane having an integral structure of a particle-removing membrane and an ion-exchange resin membrane. Polyalkylene membranes with an ion-exchange group chemically modified thereon are preferred. Polyalkylenes include, for example, polyethylene and polypropylene, and polypropylene is preferred. Cation-exchange groups are preferred as the ion-exchange group. Ion-exchange resin membranes used in the present embodiment may be commercially available filters with metal ion removal functionality. These filters are elected based on the ion exchange efficiency and with an estimated pore size of the filters as small as about 0.2 μm (200 nm).

Ion Adsorption Membrane

The ion adsorption membrane has a porous membrane material and has an ion exchange function. Such ion adsorption membrane is not particularly limited as long as it has a pore diameter of 100 μm or less and has an ion exchange function. The material, the type and the like thereof are not particularly limited. Examples of the material of a base material constituting the ion adsorption membrane include, but are not limited to, cellulose, diatomaceous earth, film material of microfiltration membrane such as nylon (resin having amide group), polyethylene, polypropylene, polystyrene, resin having imide group, resin having amide group and imide group, fluororesin, or high density polyethylene resin, a membrane material having an ion exchange ability functional group introduced therein, or the like. Examples of the shape of the membrane material include a pleated type, a flat membrane type, a hollow fiber type, a porous body as described in JP-A No. 2003-112060 and the like. As the ion exchange group to be introduced into the membrane material, it is preferable to use a combination of at least two of the cation exchange group, the chelate exchange group, and the anion exchange group to optimize the elution and selectivity of the components to be removed. Since the ion adsorption membrane has porosity, it is also possible to remove a part of the fine particles. In certain embodiments of the disclosure, the ion adsorption membrane is, for example, a nylon membrane having a pore diameter as small as 0.02 μm (20 nm).

Examples

The present disclosure will be more specifically described below based on the following examples. A material, a use amount, a ratio, treatment details, treatment procedures, and the like which will be described the following examples can be appropriately changed in a range without departing from the gist of the present invention. Accordingly, the range of the present disclosure should not be interpreted restrictively by the following examples.

Preparation of Chemical Liquids

The chemical liquid in the samples was cyclohexanone, and was prepared by subjecting the pre-processed cyclohexanone (processing target material) to an ion exchange process executed by the chemical liquid manufacturing apparatus 10 of the present disclosure.

The pre-processed cyclohexanone passed through an ion exchange medium either with proper temperature control or without temperate control. The temperature of a sample with proper temperature control was suppressed to about 50° F. to 65° F. before being subjected to an ion exchange process. The sample without temperature control passed through or processed by a same type of ion exchange medium above 70° F.

GC-MSMS

Each sample collected at the end of the ion exchange process was injected into a GC-MS/MS (gas chromatography-tandem mass spectrometer) instrument, which was used to positively identify the presence of an unknown volatile analyte.

OWPC

Each sample was collected and then inserted into a wafer coating tool. After a bare wafer was coated with a sample, the wafer was transferred to and inspected by a laser-based inspection system. By using a laser light, the laser-based inspection system detected, counted, recorded the location and sizes each particle on the wafer, at a detection limit of 19 nm. In these examples, counting targets included particles having a size of 31 nm or greater. The data was used to create wafer maps and provide the total on-wafer particle counts (OWPC), which included all particles having a size of ranging from 31 nm to 1000 nm.

RAE

Residue after evaporation (RAE, also known as non-volatile residue (NVR)) is the soluble, suspended, or particulate material remaining following the evaporation of a volatile solvent. Analysis of nonvolatile content can be used to measure the amount of micro-contamination. RAE determination was performed in a controlled laboratory environment and involved dispensing a liquid sample in a small weighing vessel, and heating the vessel to a prescribed temperature for a prescribed period of time to evaporate the organic solvent. The residue amount was determined gravimetrically by weighting the vessel before and after the evaporation of the organic solvent using a sensitive balance.

Evaluation Results

Figure 3:
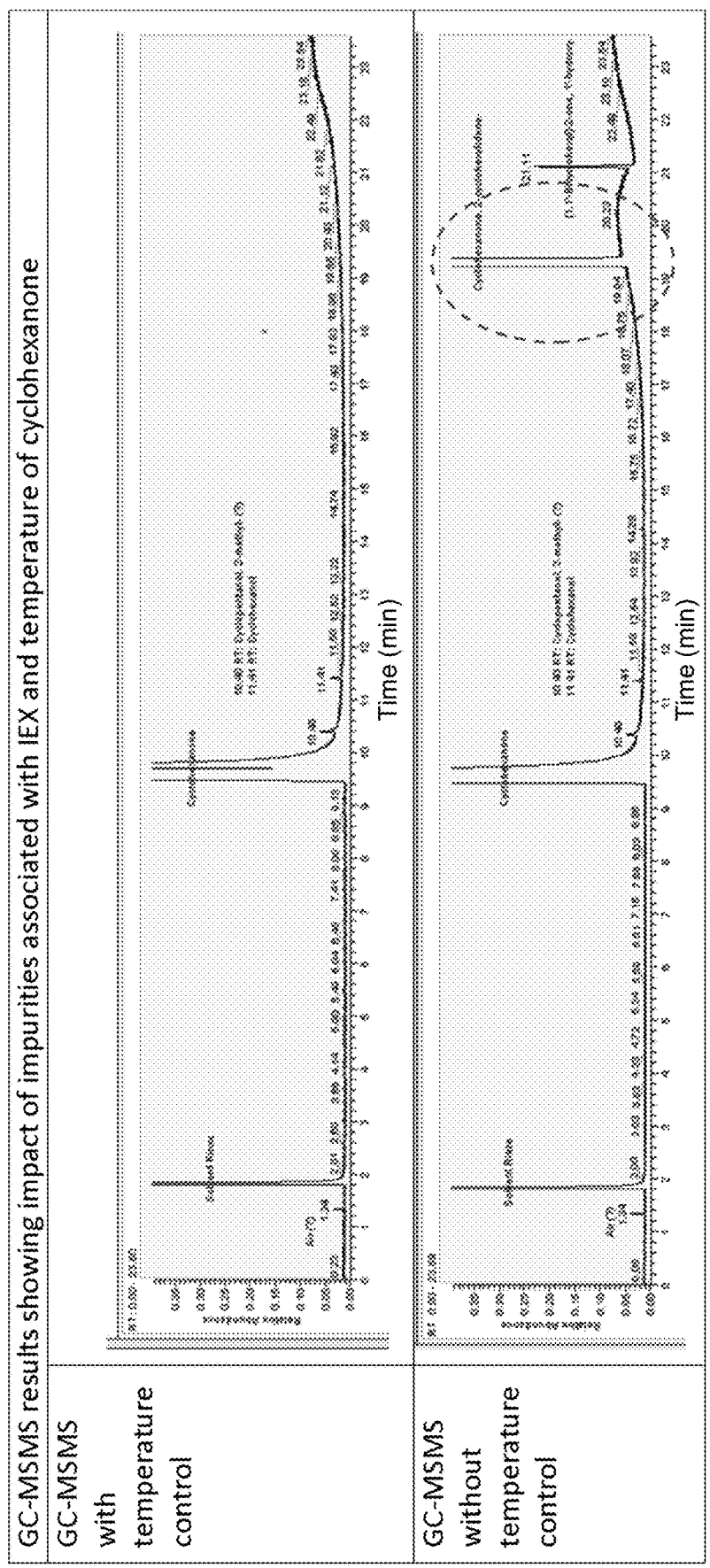
FIG. 3 illustrates the GC-MSMS results.

As shown in FIG. 3, the GC-MSMS results illustrated the impact of proper temperature control on an ion exchange process during the manufacturing of cyclohexanone. The results positively identified the presence of unwanted and previously unknown impurities (for example, a cyclohexanone dimer) associated with the manufacturing of cyclohexanone, which was conducted without temperature control. On the other hand, when the ion exchange process was performed under proper temperature control within the desired temperature range of 50° F. to 65° F., there was no detection, even of tiny amounts, of unwanted organic impurities generated in the sample.

TABLE 1

| RAE (residue after evaporation) results | |
| --- | --- |
| RAE with temperature control (50° F.) | <1 ppm |
| RAE with temperature control (65° F.) | <5 ppm |
| RAE without temperature control (70° F.) | 5-10 ppm |
| RAE without temperature control >70° F. | >10 ppm |

As shown in Table 1, the chemical liquid manufacturing method of the present disclosure was shown to have achieved the desired advantages of enhancing the removal of impurities and/or reducing unwanted by-products generated during the manufacturing of a chemical liquid. The data indicated that the non-volatile residue content of the sample without temperature control was twofold to tenfold of the samples with the proper temperature controls. As the temperature decreases, the reduction of the RAE content is more significant.

TABLE 2

| OWPC < 31 nm | |
| --- | --- |
| OWPC < 31 with temperature control (50° F.) | <300 |
| OWPC < 31 with temperature control (65° F.) | 300-500 |
| OWPC < 31 with temperature control (70° F.) | <1000 |
| OWPC < 31 without temperature control (>70° F.) | >1000 |

The results as summarized in Table 2 demonstrated that chemical liquid manufacturing method was effective in reducing the on wafer particle counts. As shown in Table 2, the OWPC having a size of 31 nm or greater from the samples with the proper temperature control was reduced almost 2 to 3 times, compared to the sample without temperature control during the ion exchange process.

Preparation of Chemical Liquids

In the following experiments, the chemical liquid in the samples was again cyclohexanone, and was prepared by subjecting the pre-processed cyclohexanone to the method of manufacturing a chemical liquid of the present disclosure by adopting the chemical liquid manufacturing apparatus 10 comprising at least the purification system 110 and the second purification system 120 of the present disclosure.

The arrangement, the selection of the filtration medium 114 in the first purification system 110 (Unit A) and the filtration medium 124 in the second filtration system 120

(Unit B), such as the functionality, the pore size, the presence or absence of a temperature controller, were adjusted to prepare a chemical liquid having a composition in each of the examples.

Evaluation Results

As shown in Table 3, each example was prepared by the chemical liquid manufacturing apparatus of the present disclosure, except that the chemical liquid manufacturing apparatus was configured differently to process the pre-processed cyclohexanone (processing target) of each example. The different configurations of the chemical liquid manufacturing apparatus for processing the pre-processed cyclohexanone were designated as processes A, B, C, D and E, respectively, as summarized in Table 3.

TABLE 3

| Process | Unit A<br>Temp controller at UPSTREAM SIDE | Unit B (Circulation unit)<br>Temp controller at<br>UPSTREAM or LOWER<br>STREAM SIDE |
|---|---|---|
| A | At least 2 distinct stages of filtration using a combination of particulate filters with pore sizes ranging from 0.05 um to 1.00 um and ion exchange medium. Membrane materials of construction including polypropylene, polyethylene and nylon. Filters can be used for multiple process cycles. | No |
| B | At least 3 distinct stages of filtration using a combination of ion exchange medium and particulate filters with pore sizes ranging from 0.05 um to 1.00 um and other particulate filters with pore sizes ranging from 0.001 um to 0.001 um . Membrane materials of construction including polypropylene, polyethylene and nylon. Filters can be used for multiple process cycles. | No |
| C | At least 3 distinct stages of filtration using a combination of ion exchange medium and particulate filters with pore sizes ranging from 0.020 um to 0.500 um. Membrane materials of construction including polypropylene, polyethylene and nylon. Filters can be used for multiple process cycles. | At least 1 distinct stage of filtration using particulate filter with pore size up to 0.003 um or ion exchange medium. Membrane materials of construction of polyethylene. Filters can be used for multiple process cycles. |
| D | At least 3 distinct stages of filtration using a combination of particulate filters with pore sizes ranging from 0.05 um to 1.00 um and ion exchange medium and other particulate filters with pore sizes ranging from 0.001 um to 0.01 um in this order. Membrane materials of construction including polypropylene, polyethylene and nylon. Filters can be used for multiple process cycles. | At least 1 distinct stage of filtration using particulate filter with pore size up to 0.003 um or ion exchange medium. Membrane materials of construction of polyethylene. Filters can be used for multiple process cycles. |
| E | At least 3 distinct stages of filtration using a combination of particulate filters with pore sizes ranging from 0.05 um to 1.00 um and ion exchange medium and other particulate filters with pore sizes ranging from 0.001 um to 0.01 um in this order. Membrane materials of construction including polypropylene, polyethylene and nylon. Filters can be used for multiple process cycles. | At least 2 distinct stage of filtration using a combination of particulate filter with pore size up to 0.003 um and ion exchange medium. Membrane materials of construction of polyethylene. Filters can be used for multiple process cycles. |

TABLE 4

| RAE (residue after evaporation) results | |
|---|---|
| Process A<br>RAE with temperature controlled at 68.5 F. | 30 to 40 ppm |
| Process A | 20 to 30 ppm |
| RAE with temperature controlled at from 50 to 67.5 F. | |
| Process A | >100 ppm |
| RAE without temperature control | |
| Process B | 10 to 20 ppm |
| RAE with temperature controlled at from 50 to 67.5 F. | |
| Process B | >100 ppm |
| RAE without temperature control | |
| Process C | 5 to 10 ppm |
| RAE with temperature controlled at from 50 to 67.5 F. | |
| Process C | >100 ppm |
| RAE without temperature control | |
| Process D | about 5 ppm |

TABLE 4-continued

RAE (residue after evaporation) results

| | |
|---|---|
| RAE with temperature controlled at from 41 to 67.5 F. Process D | >100 ppm |
| RAE without temperature control Process E | < 5 ppm |
| RAE with temperature controlled at from 50 to 67.5 F. Process E | >=100 ppm |
| RAE without temperature control | |

TABLE 5

OWPC < 31 nm

| | |
|---|---|
| Process A OWPC < 31 with temperature controlled at 68.5 F. | 2000 to 2500 |
| Process A OWPC < 31 with temperature controlled at from 50 to 67.5 F. | 1500 to 2000 |
| Process A OWPC < 31 without temperature control | >5800 |
| Process B OWPC < 31 with temperature controlled at from 50 to 67.5 F. | 1000 to 1500 |
| Process B OWPC < 31 without temperature control | >5800 |
| Process C OWPC < 31 with temperature controlled at from 50 to 67.5 F. | 500 to 1000 |
| Process C OWPC < 31 without temperature control | >5800 |
| Process D OWPC < 31 with temperature controlled at from 41 to 67.5 F. | 300 to 500 |
| Process D OWPC < 31 without temperature control | >5800 |
| Process E OWPC < 31 with temperature controlled at from 50 to 67.5 F. | <300 |
| Process E OWPC < 31 without temperature control | >5800 |

The collective results as summarized in Tables 1 to 5 and FIG. 3 confirmed that the method of manufacturing a chemical liquid by adopting the chemical liquid manufacturing apparatus of the present application achieved the desirable advantages of improving all the teste attributes which at least included significantly reducing the non-volatile residue and the OWPC, and obviating a generation of unwanted impurities during the manufacturing of the chemical liquid due to the synergistic effect between temperature control and process configuration. These data substantiated that the manufacturing method and the manufacturing apparatus of the present disclosure impede the introduction and enhance the removal of unwanted contaminants, which are stemmed from an ineffectively designed manufacturing apparatus and/or an improperly implemented method of manufacturing. Accordingly, the manufacturing method and the manufacturing apparatus of the present disclosure offer the competitive advantages of producing ultra-high purity chemical liquids, avoiding an incurrence of defects on circuit patterns and semiconductor devices, and improving the yield.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a chemical liquid, comprising:
   providing a system, the system comprising at least a first filtration medium and a second filtration medium, the first filtration medium comprising one or plural particle removal filters and the second filtration medium comprising at least one or plural ion exchange membranes and/or one or plural ion adsorption membranes, wherein the second filtration medium is configured downstream of the first filtration medium;
   configuring a temperature control unit comprising a cooling unit immediately upstream of the second filtration medium;
   processing a material by passing the material through the first filtration medium;
   regulating a temperature of the material to cool the temperature of the material to a predetermined range of about 30°F to 55°F at an immediate upstream of the second filtration medium; and
   processing the material with at a regulated temperature of the predetermined range by passing the material through the second filtration medium to produce the chemical liquid.

2. The method of claim 1, wherein the system processes the material selected from the group consisting of monomethyl ether, propylene glycol monoethyl ether, propylene glycol monopropyl ether, propylene glycol monomethyl ether acetate, ethyl lactate, methyl methoxypropionate, cyclopentanone, cyclohexanone, β-butyrolactone, diisoamyl ether, 4-methyl-2-pentanol, and a combination thereof.

3. The method of claim 1, wherein the system processes the material containing a metal component having a content about 0.1 to 1000 mass ppt.

4. The method of claim 1, wherein the chemical liquid is produced containing a metal component having a content about 0.1 to 100 mass ppt.

5. A chemical liquid manufacturing apparatus, comprising:
   a first system configured to process a material, the first system comprising a first filtration medium selected from the group consisting of at least one of a first ion exchange membrane and a first ion adsorption membrane, a second filtration medium, and a third filtration medium selected from the group consisting of at least one of a third ion exchange membrane and a third ion adsorption membrane, wherein the second filtration medium is configured upstream of the first filtration medium and the third filtration medium; and
   a temperature control unit comprising a cooling unit configured downstream of the second filtration medium, and immediately upstream of the first filtration medium or the third filtration medium to cool a temperature of the material to a predetermined range of about 30°F to 55°F before being processed the first filtration medium or the third filtration medium.

6. The chemical manufacturing apparatus of claim 5, wherein the second filtration medium comprises a particle removal filter having a pore size of 10 nm or less.

7. The chemical manufacturing apparatus of claim 5, wherein the second filtration medium comprises a particle removal filter having a pore size of 20 nm or higher.

8. The chemical manufacturing apparatus of claim 5, wherein the first system is configured to process an organic solvent.

9. The chemical manufacturing apparatus of claim 8, wherein the organic solvent is selected from the group consisting of monomethyl ether, propylene glycol monoethyl ether, propylene glycol monopropyl ether, propylene glycol monomethyl ether acetate, ethyl lactate, methyl methoxypropionate, cyclopentanone, cyclohexanone, β-butyrolactone, diisoamyl ether, 4-methyl-2-pentanol, and a combination thereof.

10. The chemical manufacturing apparatus of claim 5 further comprising a second system to process the material, and the second system comprising at least one second filtration medium, selected from the group consisting of a second ion exchange membrane and a second ion adsorption membrane, wherein another temperature control unit is configured at an upstream side of the at least one second filtration medium, and the another temperature control unit comprises another cooling unit configured to cool the temperature of the material to another predetermined range before being processed by the second system.

11. The chemical manufacturing apparatus of claim 10, wherein the another temperature control unit is configured to cool the temperature of the material to 65°F or below.

12. The chemical manufacturing apparatus of claim 10, wherein the another temperature control unit is prevented from rising to a temperature of 70°F or above.

13. The chemical manufacturing apparatus of claim 10, wherein the second system is configured at a downstream side of the first system.

14. The method of claim 1, wherein the system comprises a housing accommodating the second filtration medium, the temperature control unit comprising the cooling unit is configured at an entry port of the housing, and the temperature of the material is cooled to the predetermined range prior to an entry into the housing.

15. The chemical manufacturing apparatus of claim 5 further comprising a first housing accommodating the first filtration medium and a third housing accommodating the third filtration medium, wherein the temperature control unit is configured immediately upstream of the first housing or the third housing.

* * * * *